US008994108B2

(12) United States Patent  
Chang et al.

(10) Patent No.: US 8,994,108 B2
(45) Date of Patent: Mar. 31, 2015

(54) DIODE STRUCTURE AND METHOD FOR WIRE-LAST NANOMESH TECHNOLOGIES

(71) Applicant: International Business Machines Corporation, Armonk, NY (US)

(72) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/971,974

(22) Filed: Aug. 21, 2013

(65) Prior Publication Data

US 2014/0217364 A1    Aug. 7, 2014

Related U.S. Application Data

(63) Continuation of application No. 13/761,476, filed on Feb. 7, 2013.

(51) Int. Cl.
*H01L 27/12*    (2006.01)
*H01L 29/66*    (2006.01)
(Continued)

(52) U.S. Cl.
CPC ...... *H01L 27/1203* (2013.01); *H01L 29/66477* (2013.01); *H01L 29/78* (2013.01); *B82Y 99/00* (2013.01); *Y10S 977/762* (2013.01)
USPC .......................................... 257/347; 977/762

(58) Field of Classification Search
CPC . B82Y 10/00; Y10S 977/938; H01L 27/0629; H01L 27/0688; H01L 21/7624; H01L 21/76264; H01L 21/823431; H01L 21/823821; H01L 21/84; H01L 21/845; H01L 27/0255; H01L 27/0266; H01L 27/0727; H01L 27/0814; H01L 27/0886; H01L 27/0924; H01L 27/1203; H01L 27/1211; H01L 29/41791; H01L 29/6603; H01L 29/6609; H01L 29/66136; H01L 29/66795; H01L 29/7804; H01L 29/7806; H01L 29/7808; H01L 29/785; H01L 29/861; H01L 29/8613
See application file for complete search history.

(56) References Cited

U.S. PATENT DOCUMENTS 5,333,093 A * 7/1994 Krautschneider et al. ...... 361/56
6,104,045 A * 8/2000 Forbes et al. ................. 257/141
(Continued)

OTHER PUBLICATIONS

S. Bangsaruntip et al., "High performance and highly uniform gate-all-around silicon nanowire MOSFETs with wire size dependent scaling," 2009 IEEE International Electron Devices Meeting (IEDM), Dec. 7-9, 2009, pp. 297-300.

*Primary Examiner* — Khiem D Nguyen
*Assistant Examiner* — Pauline Vu
(74) *Attorney, Agent, or Firm* — Louis J. Percello; Michael J. Chang, LLC

(57) ABSTRACT

In one aspect, a method of fabricating an electronic device includes the following steps. An alternating series of device and sacrificial layers are formed in a stack on an SOI wafer. Nanowire bars are etched into the device/sacrificial layers such that each of the device layers in a first portion of the stack and each of the device layers in a second portion of the stack has a source region, a drain region and a plurality of nanowire channels connecting the source region and the drain region. The sacrificial layers are removed from between the nanowire bars. A conformal gate dielectric layer is selectively formed surrounding the nanowire channels in the first portion of the stack which serve as a channel region of a nanomesh FET transistor. Gates are formed surrounding the nanowire channels in the first and second portions of the stack.

8 Claims, 8 Drawing Sheets

(51) Int. Cl.
*H01L 29/78* (2006.01)
*B82Y 99/00* (2011.01)

(56) References Cited

U.S. PATENT DOCUMENTS

| | | | |
|---|---|---|---|
| 6,835,967 B2 | 12/2004 | Yeo et al. | |
| 6,987,289 B2 | 1/2006 | Nowak | |
| 7,432,122 B2 | 10/2008 | Mathew et al. | |
| 7,560,784 B2 | 7/2009 | Cheng et al. | |
| 7,884,004 B2 | 2/2011 | Bangsaruntip et al. | |
| 7,888,775 B2 | 2/2011 | Russ et al. | |
| 7,893,492 B2 | 2/2011 | Bedell et al. | |
| 7,923,337 B2 | 4/2011 | Chang et al. | |
| 2005/0029654 A1* | 2/2005 | Mio et al. | 257/734 |
| 2005/0266645 A1 | 12/2005 | Park | |
| 2006/0063334 A1 | 3/2006 | Donze et al. | |
| 2007/0034971 A1 | 2/2007 | Anderson et al. | |
| 2008/0135949 A1 | 6/2008 | Lo et al. | |
| 2009/0020787 A1* | 1/2009 | Shioya et al. | 257/213 |
| 2009/0078997 A1 | 3/2009 | Greene et al. | |
| 2010/0295022 A1 | 11/2010 | Chang et al. | |
| 2011/0012085 A1* | 1/2011 | Deligianni et al. | 257/9 |
| 2011/0013668 A1 | 1/2011 | Pacha et al. | |
| 2011/0031473 A1* | 2/2011 | Chang et al. | 257/24 |
| 2011/0108900 A1 | 5/2011 | Chang et al. | |
| 2011/0111596 A1 | 5/2011 | Kanakasabapathy | |
| 2011/0133162 A1 | 6/2011 | Bangsaruntip et al. | |
| 2011/0133163 A1* | 6/2011 | Bangsaruntip et al. | 257/24 |
| 2011/0193183 A1 | 8/2011 | Agarwal et al. | |
| 2011/0220876 A1* | 9/2011 | Nishizawa et al. | 257/30 |
| 2011/0233522 A1* | 9/2011 | Cohen et al. | 257/24 |
| 2012/0007051 A1 | 1/2012 | Bangsaruntip et al. | |
| 2012/0007052 A1* | 1/2012 | Hobbs et al. | 257/24 |
| 2012/0181506 A1 | 7/2012 | Farmer et al. | |
| 2012/0319178 A1* | 12/2012 | Chang et al. | 257/287 |
| 2013/0148409 A1 | 6/2013 | Chung | |
| 2013/0175578 A1 | 7/2013 | Lee et al. | |
| 2014/0034905 A1 | 2/2014 | Bangsaruntip et al. | |

* cited by examiner

DIODE STRUCTURE AND METHOD FOR WIRE-LAST NANOMESH TECHNOLOGIES

CROSS-REFERENCE TO RELATED APPLICATION(S)

This application is a continuation of U.S. application Ser. No. 13/761,476 filed on Feb. 7, 2013, the disclosure of which is incorporated by reference herein.

FIELD OF THE INVENTION

The present invention relates to nanomesh field-effect transistor (FET)-based electronic devices, and more particularly, to techniques for fabricating nanomesh FET diode devices.

BACKGROUND OF THE INVENTION

Non-transistor field effect transistor (FET) elements, such as capacitors and diodes are important elements in complementary metal-oxide semiconductor (CMOS) technology. Much research has been done regarding planar diode and capacitor device structures. See, for example, U.S. Patent Application Publication Number 2011/0108900 A1 filed by Chang et al., entitled "Bi-Directional Self-Aligned FET Capacitor."

However, the use of non-planar devices in future CMOS technologies is becoming increasingly more pervasive. One key issue in the use of these devices is other critical technology elements, such as diodes.

Therefore, solutions for diodes in nanomesh FET technologies would be desirable.

SUMMARY OF THE INVENTION

The present invention provides techniques for fabricating nanomesh field-effect transistor (FET)-based electronic devices. In one aspect of the invention, a method of fabricating an electronic device is provided. The method includes the following steps. A semiconductor-on-insulator (SOI) wafer is provided having a SOI layer over a buried oxide (BOX). An alternating series of device layers and sacrificial layers are formed in a stack on the wafer. Nanowire bars are etched into the device layers and sacrificial layers in at least one first portion and in at least one second portion of the stack such that each of the device layers in the first portion of the stack and each of the device layers in the second portion of the stack has a source region, a drain region and a plurality of nanowire channels connecting the source region and the drain region. The sacrificial layers are removed from between the nanowire bars. A conformal gate dielectric layer is selectively formed surrounding the nanowire channels in the first portion of the stack which serve as a channel region of a nanomesh FET transistor. A first gate is formed on the conformal gate dielectric layer surrounding the nanowire channels in the first portion of the stack which serve as the channel region of the nanomesh FET transistor in a gate all around configuration. A second gate is formed surrounding the nanowire channels in the second portion of the stack which serve as a channel region of a nanomesh FET-diode in a gate all around configuration.

In another aspect of the invention, an electronic device is provided. The electronic device includes, an alternating series of device layers and sacrificial layers in a stack on a SOI wafer having a SOI layer over a BOX, wherein each of the device layers in at least one first portion and in at least one second portion of the stack has a source region, a drain region and a plurality of nanowire channels connecting the source region and the drain region; a conformal gate dielectric layer surrounding the nanowire channels in the first portion of the stack which serve as a channel region of a nanomesh FET transistor; a first gate on the conformal gate dielectric layer surrounding the nanowire channels in the first portion of the stack which serve as the channel region of the nanomesh FET transistor in a gate all around configuration; and a second gate surrounding the nanowire channels in the second portion of the stack which serve as a channel region of a nanomesh FET-diode in a gate all around configuration.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating diodes in nanomesh-based devices. Techniques for fabricating diodes in FINFET devices are described for example in U.S. patent application Ser. No. 13/761,430, filed on Feb. 7, 2013, entitled "Diode Structure and Method for FINFET Technologies," the contents of which are incorporated by reference herein. Techniques for fabricating diodes in gate-all-around nanowire devices are described for example in U.S. patent application Ser. No. 13/761,453, filed on Feb. 7, 2013, entitled "Diode Structure and Method for Gate All Around Silicon Nanowire Technologies," the contents of which are incorporated by reference herein.

The present techniques assume a replacement gate fabrication process flow (also referred to herein as a "gate-last" approach). As will be apparent from the following description, in a replacement gate or gate-last approach, a dummy gate is formed and then replaced later in the process with a permanent, replacement gate.

The present techniques will be described by way of reference to FIGS. 1-13. In order to illustrate the compatibility of the present techniques with the fabrication of non-diode devices, the following description and related figures will describe/depict the fabrication of a diode and a non-diode device on a common wafer. For instance, the fabrication of a nanomesh FET-diode and a regular nanomesh FET transistor on a common wafer will be described. It is to be understood however that any combination of diode and non-diode devices (or even simply one or more diode devices alone) may be produced using the present techniques.

Figure 1:
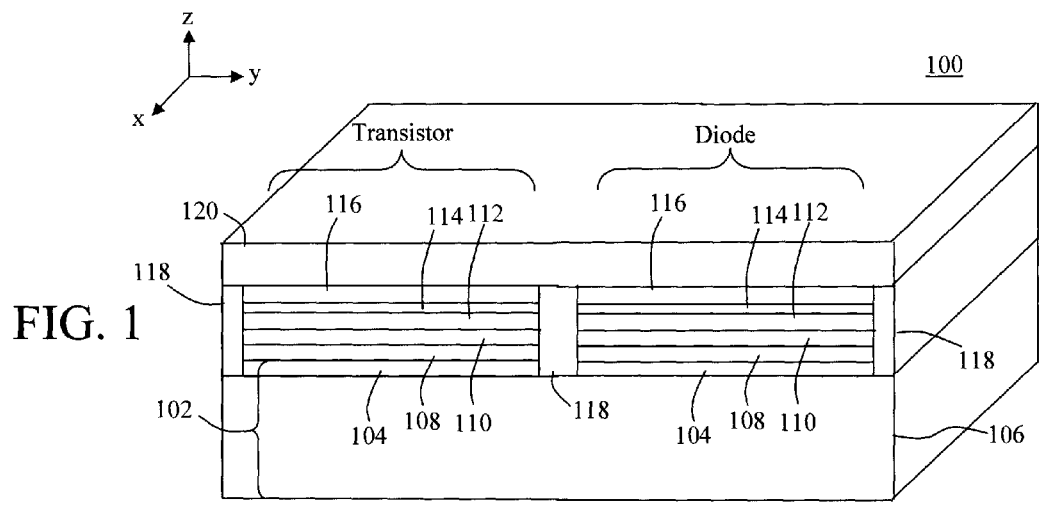
FIG. 1 is a cross-sectional diagram illustrating a starting structure for fabrication of nanomesh field-effect transistor (FET) and diode devices according to an embodiment of the present invention.

FIG. 1 is a cross-sectional diagram illustrating a starting structure 100 for the device fabrication. To form structure 100, a wafer 102 is provided having a silicon-on-insulator (SOI) layer 104 over a buried oxide (BOX) layer 106. According to an exemplary embodiment, SOI layer 104 has a thickness of from about five nanometers (nm) to about 20 nm. An SOI wafer commonly also includes other layers, such as a substrate beneath the BOX, which are not shown in this depiction. BOX layer 106 can be formed from any suitable insulator material including, but not limited to, dielectric materials, such as silicon dioxide ($SiO_2$).

An alternating series of device layers (e.g., silicon (Si), germanium (Ge), silicon germanium (SiGe), III-V semiconductor, etc.) and sacrificial layers are then formed, e.g., epitaxially grown, on the wafer in a vertical stack, with SOI layer 104 as the first device layer in the series/stack. Specifically, starting with SOI layer 104 and moving upward, a first sacrificial layer 108 is epitaxially grown over SOI layer 104. Each of the device layers will be used to form a source and drain region and nanowire channels of the FET devices (i.e., each device layer will have a source region, a drain region and nanowire channels connecting the source and drain regions). A sacrificial layer is simply a layer that is removed from the channel—see below—and like the device layer(s) can be a semiconductor since the sacrificial layer is preferably crystalline for subsequent epitaxial layers to be grown. So by way of example only, in a Si/SiGe stack, the Si could be the device layer and SiGe the channel layer for PFETs, and vice versa for NFETs.

The term III-V semiconductor, as used herein, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations including at least one of the foregoing materials.

Sacrificial layer 108 is formed from a crystalline material which can be etched selectively to the device layer material, such as SiGe when the device layer material is Si, or vice-a-versa. Sacrificial layer 108 can contain a high concentration of dopants which, when introduced into the device layers (by way of an anneal performed later on in the process), results in either n-type or p-type doping of the device layers. For example, phosphorous (P) or arsenic (As) are typical n-type dopants and boron (B) is a typical p-type dopant. Dopant concentrations of from about $1\times10^{19}$ atoms per cubic centimeter (atoms/$cm^3$) to about $1\times10^{22}$ atoms/$cm^3$ may be employed. The doping may be performed in-situ (i.e., dopants are incorporated during the growth of sacrificial layer 108) or ex-situ (after the growth of sacrificial layer 108 using techniques such as ion implantation).

An optional undoped crystalline (e.g., Si, Ge, SiGe, III-V semiconductor, etc.—see above) device layer 110 may be epitaxially grown over sacrificial layer 108. Further, one or more additional sacrificial layers and/or crystalline device layers may optionally be epitaxially grown in an alternating fashion on top of device layer 110, in which the properties of the additional sacrificial layer(s) are the same as sacrificial layer 108, and the properties of the additional crystalline device layer(s) are the same as device layer 110. For illustrative purposes, one additional sacrificial layer 112 is shown on top of device layer 110. However, as highlighted above, these layers are optional, and embodiments are anticipated herein where these layers are not present and/or more or fewer of these layers are present than is shown. According to an exemplary embodiment, sacrificial layers 108 and 112 are doped the same as one another. In the exemplary configuration shown depicted in FIG. 1, a crystalline device layer 114 is next epitaxially grown over sacrificial layer 112. It is notable that, if desired, the thickness of device layer 114 can be varied vis-à-vis SOI layer 104 and device layer 110 to achieve a multiple threshold device as described, e.g., in U.S. Patent Application Publication Number 2010/0295022, filed by Chang et al., entitled "Nanowire Mesh with Multiple Threshold Voltages" (hereinafter "U.S. Patent Application Publication Number 2010/0295022") the contents of which are incorporated by reference herein.

Each sacrificial layer may be deposited by way of an epitaxial growth process. As such, each sacrificial layer may contain a single crystalline material. According to an exemplary embodiment, each sacrificial layer has a thickness of from about five nanometers (nm) to about 20 nm. To minimize parasitic capacitance, the thickness of each sacrificial layer should be as small as possible while still leaving enough room for a dielectric and gate to fit in the gap formed once the sacrificial layer is removed later on in the process (see below). Similarly, each device layer may also be deposited by way of an epitaxial growth process. As such, each device layer may also contain a single crystalline material.

A first hardmask 116 is deposited over device layer 114. According to an exemplary embodiment, hardmask 116 is formed from an oxide, such as silicon dioxide ($SiO_2$), and is deposited over device layer 114 using chemical vapor deposition (CVD) or plasma enhanced CVD (PECVD).

STI is then used to planarize and (by way of an STI region, formed as described below) isolate distinct portions of the device layer/sacrificial layer stack to areas of the wafer which, in this example, will be used to form a nanomesh FET-diode device and a nanomesh FET transistor device, respectively. As provided above, this configuration is being used merely to illustrate the present techniques. Any number or combination of devices may be fabricated using the instant process.

STI involves common lithography and etching processes which are well known to those of skill in the art, and thus are not described further herein. STI is generally employed with process technology in the nanometer feature size range. A nitride liner 118 (also referred to herein as an STI region) is formed adjacent to one or more sidewalls of the stack using a deposition process, such as CVD, PECVD or atomic layer deposition (ALD). The distinct stacks now formed in the wafer will be used later in the process to form source and drain regions and nanowire channels of each of the FET devices. The arrangement of the various layers in the stack defines the location of the nanowire channels in the z-direction.

A second hardmask 120 is then deposited over the (e.g., transistor and diode) stacks. According to an exemplary embodiment, hardmask 120 is formed from a nitride material, such as silicon nitride (SiN) and is deposited using low-pressure chemical vapor deposition (LPCVD) to a thickness of from about 15 nm to about 20 nm, e.g., about 20 nm. As will be described in detail below, hardmask 116 and hardmask 120 will be patterned (in accordance with a desired location of the nanowire channels in the x-direction) into a plurality of individual nanowire hardmasks.

Figure 2:
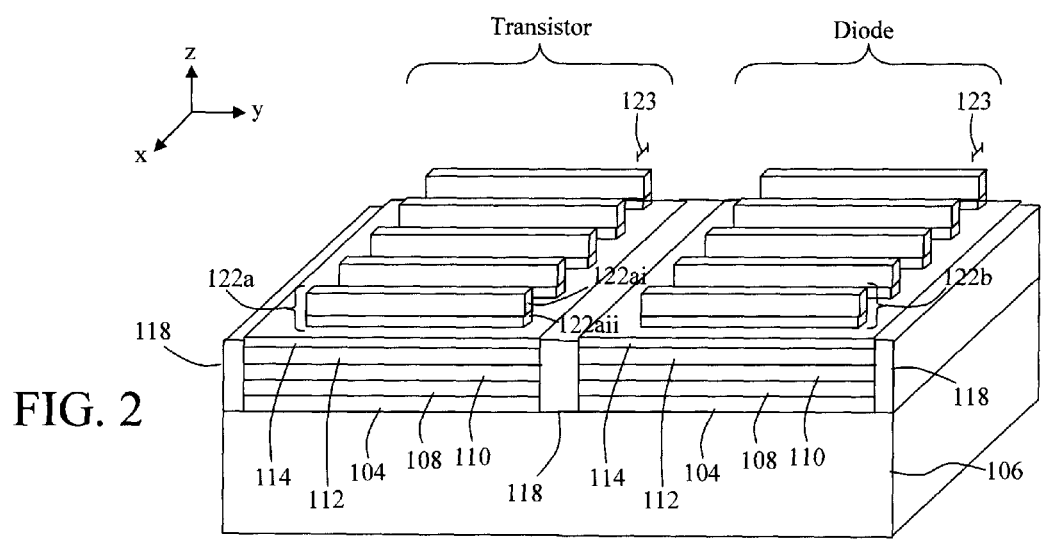
FIG. 2 is a cross-sectional diagram illustrating a plurality of nanowire hardmasks according to an embodiment of the present invention.

FIG. 2 is a cross-sectional diagram illustrating the first hardmask 116 and the second hardmask 120 having been patterned into a plurality of individual nanowire hardmasks 122a and 122b (in this particular example corresponding to the nanomesh FET transistor and the nanomesh FET-diode, respectively). As highlighted above, the patterning of the hardmasks is commensurate with a desired footprint and location of the nanowires. According to an exemplary embodiment, a resist film (not shown) is deposited on hardmask 120 and patterned with the footprint and location of each of the nanowire hardmasks 122a/122b. In one example, reactive ion etching (RIE) (see below) is used to form the nanowire hardmasks, and therefore the resist film may be formed from a resist material such as hydrogen silsesquioxane (HSQ) patterned using electron beam (e-beam) lithography and transferred to a carbon-based resist.

A hardmask open stage is then performed using a series of selective RIE steps based on the fact that the first hardmask is formed from an oxide material, while the second hardmask is formed from a nitride material—see above. For example, a nitride-selective RIE using the resist film (not shown) as a mask is first used to remove all but the portions of hardmask 120 thereunder, defining a nitride portion 122ai of the nanowire hardmasks. Hardmask 116, which is formed from an oxide, acts as an etch stop for the nitride-selective RIE. The nitride-selective RIE can also at the same time etch nitride liner 118, with device layer 114 acting as an etch stop.

Next, using the nitride portion as a mask, an oxide-selective RIE is used to remove all but the portions of hardmask 116 beneath the nitride mask, defining an oxide portion 122aii of the nanowire hardmasks. Device layer 114 acts as an etch stop for the oxide-selective RIE. In this example, the nitride portions 122ai and the oxide portions 122aii of the nanowire hardmasks each have thicknesses of from about 2 nm to about 20 nm, e.g., about 10 nm. The same process would occur simultaneously to form the nanowire hardmasks 122b (having a nitride portion 122bi and an oxide portion 122bii—which, for ease of depiction, are not explicitly labeled in FIG. 2). It is notable that this step of etching the oxide portion of the nanowire hardmasks at this stage in the process is optional. Alternatively, the oxide hardmask layer could be left in place as an etch stop later for the dummy gate etch—see for example the description of FIG. 3, below—with the outer portion removed after the dummy gate RIE and the inner portion removed before the nanowire bar RIE.

Nitride portions 122ai/122bi and oxide portions 122aii/122bii form a dual nanowire hardmask structure. The use of a dual nanowire hardmask structure permits more precise and uniform nanowires to be formed in the device layers. Namely, with the dual hardmask structure, the nitride portion 122ai/122bi protects the integrity of the oxide portion 122aii/122bii during dummy gate definition (see FIG. 3, described below), and the oxide portion 122aii/122bii protects the nanowire channels during spacer (nitride-selective) etch (see description below). Maintaining good integrity of the nanowire hardmasks is important for minimizing variations in nanowire dimensions. As device sizes become increasingly smaller, the effect of unwanted dimensional variations becomes even more pronounced.

In this example, the nanowire hardmasks 122a/122b are configured to have a pitch, i.e., a spatial frequency, of less than about 200 nm, for example, from about 10 nm to about 200 nm, e.g., from about 30 nm to about 40 nm. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching can be used. A width 123 of each nanowire hardmask 122a/122b is less than about 40 nm, for example, from about five nm to about 40 nm, e.g., from about five nm to about 20 nm. The pitch/width of each nanowire hardmask 122a/122b will initially determine a lateral pitch/width of each nanowire channel stack.

Figure 3:
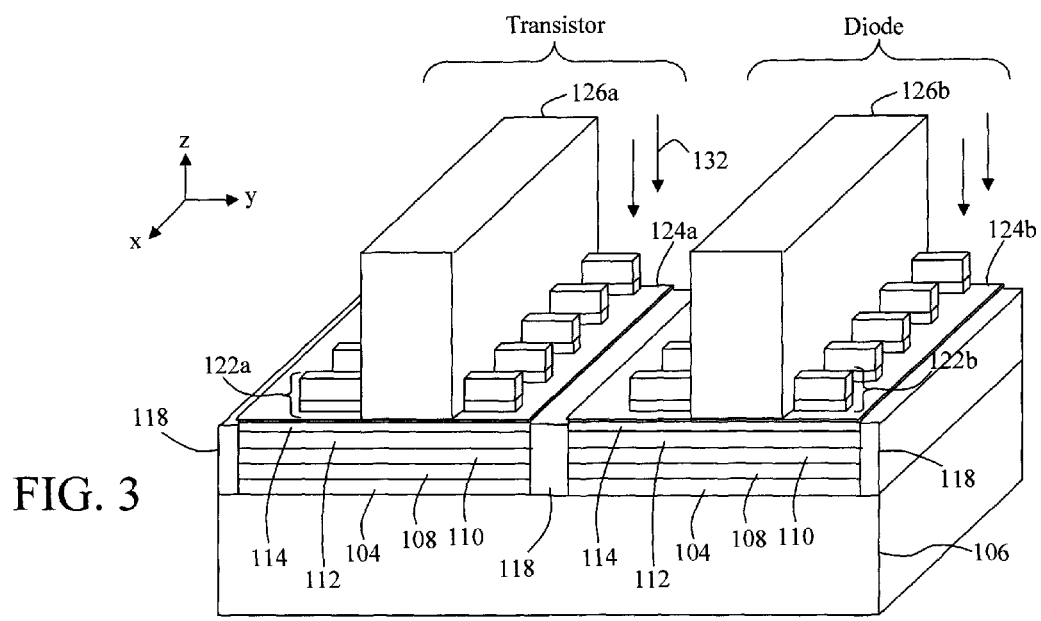
FIG. 3 is a cross-sectional diagram illustrating dummy gate structures having been formed over the nanomesh FET transistor and the nanomesh FET-diode stacks according to an embodiment of the present invention.

FIG. 3 is a cross-sectional diagram illustrating dummy gate structures 126a/126b having been formed over the nanomesh FET transistor and the nanomesh FET-diode stacks, respectively. Prior to forming the dummy gate, an oxide stopping layer, i.e., oxide layers 124a/124b, may be formed on device layer 114 over the nanomesh FET transistor and the nanomesh FET-diode stacks, respectively. According to an exemplary embodiment, thermal oxidation is used to grow the oxide layers to a thickness of up to about four nm, e.g., up to about two nm. However, if the oxide hardmask layer is not etched in the previous step, then it can be used here as an etch stop, meaning that a new etch stop layer does not need to be made.

To begin the damascene gate process, dummy gate structures 126a/126b are formed. As will be apparent from the description that follows, the dummy gate structures 126a/126b define a location of the nanowires in a y-direction, as well as a location of the gates in the final nanomesh FET transistor and nanomesh FET-diode devices, respectively. According to an exemplary embodiment, the dummy gate structures are formed from polycrystalline Si (polysilicon).

Dummy gate structures 126a/126b can be formed by the following process. A polysilicon layer is first deposited over the oxide layers/nanowire hardmasks using LPCVD to a thickness of from about 100 nm to about 150 nm, e.g., about 140 nm. Since the thickness of the polysilicon layer will determine a height of the dummy gate structures, chemical-mechanical polishing (CMP) may be used after deposition to achieve a desired thickness/height. A resist film (not shown) is deposited on the polysilicon layer, masked and patterned with a footprint and location of the dummy gate structures. Polysilicon-selective RIE is then used to remove all but portions of the polysilicon layer under the masks, i.e., those portions of the polysilicon layer located over the nanowire hardmasks (centered over the nanowire hardmasks in the y-direction), which are dummy gate structures 126a/126b.

As indicated by arrows 132, a top-down implant may optionally be used to dope device layer 114 and potentially also device layer 110 and SOI layer 104 below. The conditions for this implant are well known to those skilled in the art and may vary depending on the type of dopant species employed. The top-down implant may be used, for example, when the sacrificial layers were not doped earlier in the process, or where the amount of doping that will be obtained from the sacrificial layers (during a diffusion/activation anneal described below) is not sufficient and the top-down implant is used to supplement that doping.

Figure 4:
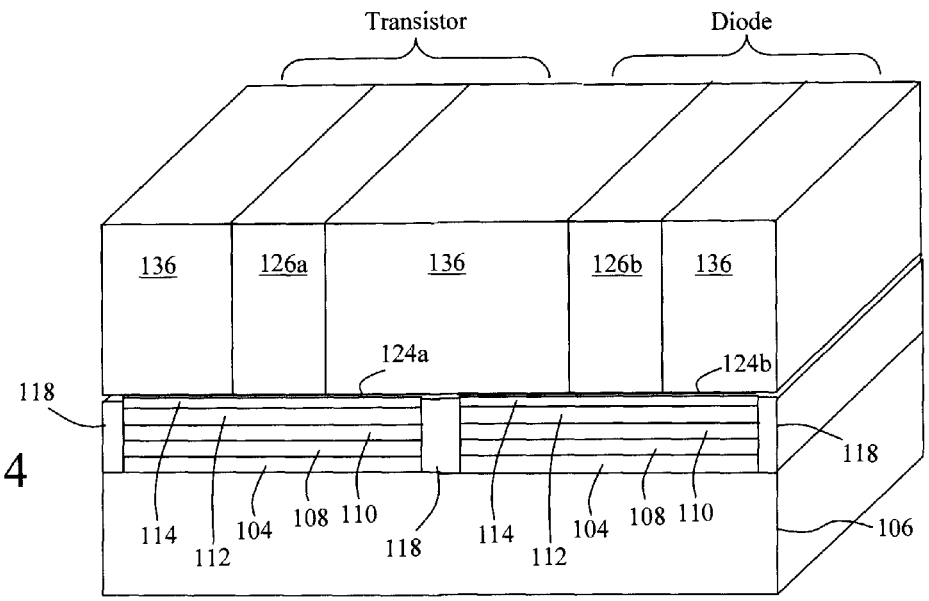
FIG. 4 is a cross-sectional diagram illustrating a (sacrificial) filler layer having been deposited around the dummy gate structures according to an embodiment of the present invention.

FIG. 4 is a cross-sectional diagram illustrating a (sacrificial) filler layer 136 deposited around the dummy gate structures 126a/126b. Filler layer 136 can be formed from any suitable filler material, including but not limited to, a dielectric material, such as $SiO_2$. According to an exemplary embodiment, the filler layer 136 is deposited around dummy gate structures 126a/126b using a high-density plasma (HDP). CMP is then used to planarize the filler material, using the dummy gate structures as an etch stop.

Figure 5:
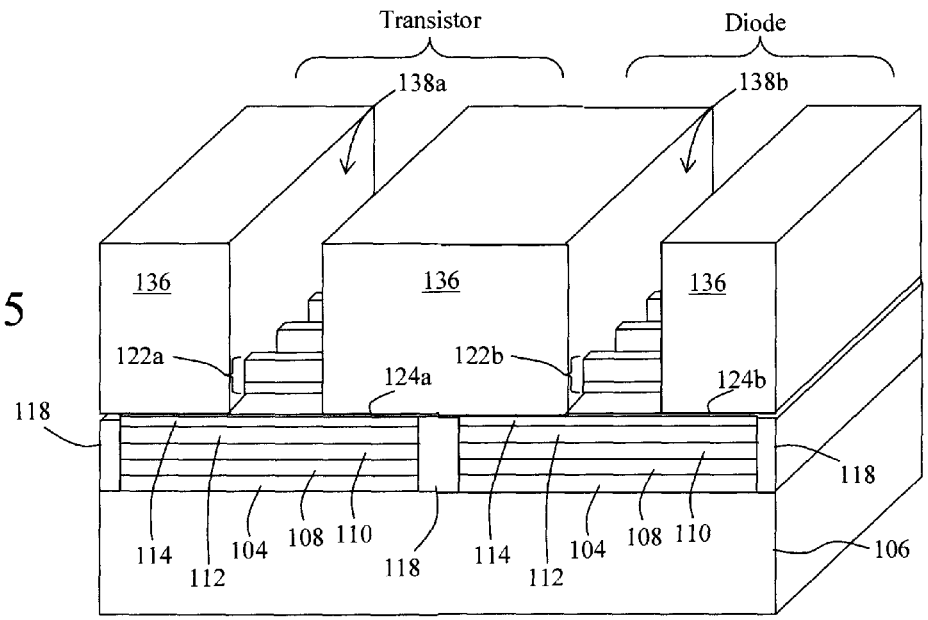
FIG. 5 is a cross-sectional diagram illustrating the dummy gate structures having been removed resulting in trenches being formed in the filler layer according to an embodiment of the present invention.

FIG. 5 is a cross-sectional diagram illustrating the dummy gates having been removed. Dummy gates 126a/126b can be removed using a chemical etching process, such as chemical down-stream or potassium hydroxide (KOH) etching, or RIE. As shown in FIG. 5, removal of dummy gates 126a/126b results in trenches 138a/138b, respectively, being formed in filler layer 136. Since trenches 138a/138b are negative patterns of dummy gate 126a/126b, trenches 138a/138b are also centrally located (i.e., in a y-direction) over nanowire hardmasks 122a/122b, over the nanomesh FET transistor and the nanomesh FET-diode stacks, respectively. According to an exemplary embodiment, trenches 138a/138b distinguish a (nanowire) channel region from source and drain regions of the respective devices. The etching may also have an effect on the filler layer 136, removing a portion thereof.

The use of dummy gate structures is an important aspect of the present techniques. Namely, the dummy gate structures allow for the nanowire hardmasks to be placed prior to the filler layer, such that when the dummy gate structures are removed, the nanowire hardmasks revealed are already present within the trenches (as shown in FIG. 5. The nanowire hardmasks are important for more precise and uniform nanowires to be formed in the device regions. The dummy gate structures also allow top-down implants indicated by arrows 132 in FIG. 3 to be blocked from channel regions in a self-aligned manner.

Figure 6:
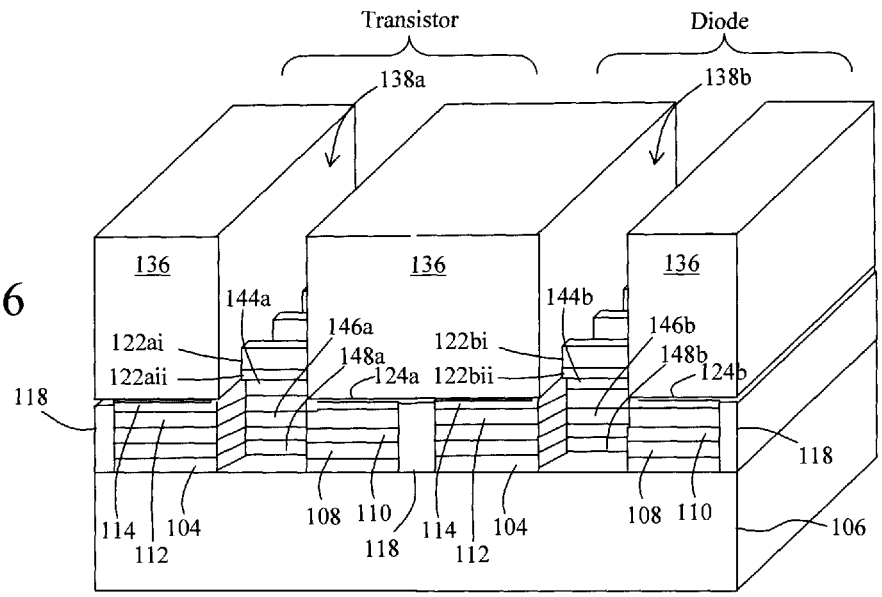
FIG. 6 is a cross-sectional diagram illustrating nanowire bars having been etched into the semiconductor layers of the device in each of the nanomesh FET transistor and the nanomesh FET-diode stacks according to an embodiment of the present invention.

FIG. 6 is a cross-sectional diagram illustrating nanowire bars 144a/144b, 146a/146b, and 148a/148b (which are precursors to nanowire channels of the device) having been etched into the device layers, i.e., device layer 114, device layer 110 and SOI layer 104, respectively, in each of the nanomesh FET transistor and the nanomesh FET-diode stacks, respectively. The term "bar" is used to refer to an as-etched nanowire structure, prior to any further processing (e.g., thinning and/or suspending) that results in completed nanowire channels of the FET devices. The device layers in the nanomesh FET transistor stack may also be referred to herein as a (e.g., first) set of device layers so as to distinguish them from the device layers in the nanomesh FET-diode stack which may be referred to herein as a (e.g., second) set of device layers. As shown in FIG. 6, the nanowire bars are in a stacked configuration with nanowire bars 144a/144b above nanowire bars 146a/146b, and nanowire bars 146a/146b above nanowire bars 148a/148b, respectively.

According to an exemplary embodiment, a RIE is used to remove portions of device layer 114/device layer 110/SOI layer 104 and sacrificial layers 108/112 selectively to nitride and oxide, so that material within trenches 138a/138b not masked by the nanowire hardmasks 122a/122b, is removed. The nanowire bars patterned in this manner will have sharp, well-defined edges. As described above, this is a result of using dual (nitride/oxide) hardmasks to pattern the nanowires.

An advantage of the present teachings is that nanowire bars are etched only within the trenches 138a/138b, leaving the source/drain regions of the respective devices intact below the filler layer 136. Further, the source/drain regions produced in this manner will be self-aligned with the corresponding trenches 138a/138b and thus with a device gate that will be formed in trenches 138a/138b (see description below). By way of example only, nanowire bars 144a/144b, 146a/146b, and 148a/148b formed in this manner can have a pitch, i.e., a spatial frequency of bars within the same device layer, of less than about 200 nm, for example, from about 10 nm to about 200 nm, e.g., from about 40 nm to about 50 nm. Further, the nanowire bars 144a/144b, 146a/146b, and 148a/148b will each have a width defined by a width of the nanowire hardmasks 122, i.e., of less than about 40 nm, for example, from about five nm to about 40 nm, e.g., from about five nm to about 20 nm.

It is notable that the techniques described, for example, in U.S. Patent Application Publication Number 2010/0295022 may be implemented if so desired to attain multiple threshold voltage devices. This would entail a step to selectively thin one or more the nanowire bars. See U.S. Patent Application Publication Number 2010/0295022. That thinning step could optionally be performed at this stage of the process. It is also notable that the labeling of the individual nitride/Oxide hardmask layers is shown in FIG. 6 to highlight how in a subsequent step the nitride portion within each of the trenches is removed selective to the oxide portion.

Figure 7:
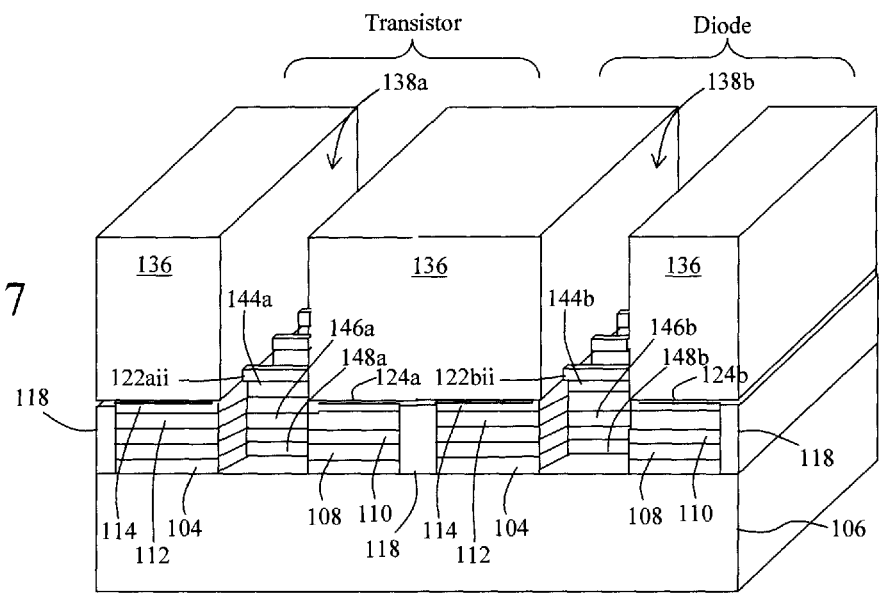
FIG. 7 is a cross-sectional diagram illustrating the exposed nitride portions of the nanowire hardmasks having been removed according to an embodiment of the present invention.

Namely, FIG. 7 is a cross-sectional diagram illustrating the exposed nitride portions 122ai/122bi (i.e., portions within trenches 138a/138b, respectively) of the nanowire hardmasks having been removed. Any etching process selective for removal of the nitride portions of the nanowire hardmasks relative to the oxide portions may be used. Ideally, however, the thickness of the nitride portion of the nanowire hardmasks should have been chosen such that it is mostly consumed during the previous bar etch, so there should not be much left on the structure at this point. The oxide portions 122aii/122bii of the hardmasks are ideally designed so that they are entirely consumed during the spacer etch (see FIG. 8, described below) and sacrificial material removal (see FIG. 9, described below). Any of the oxide hardmask remaining after the spacer etch and sacrificial material removal should be thin enough to be removed during a clean preceding sacrificial material removal gate stack deposition. The gate stack pre-clean is a standard process that removes organic contaminants, metallic contaminants and any native oxide on the surface of the Si. The native oxides can be removed using either a wet or dry chemical etch process for removing oxide. An example would be 100:1 dilute hydrofluoric acid (HF).

Figure 8:
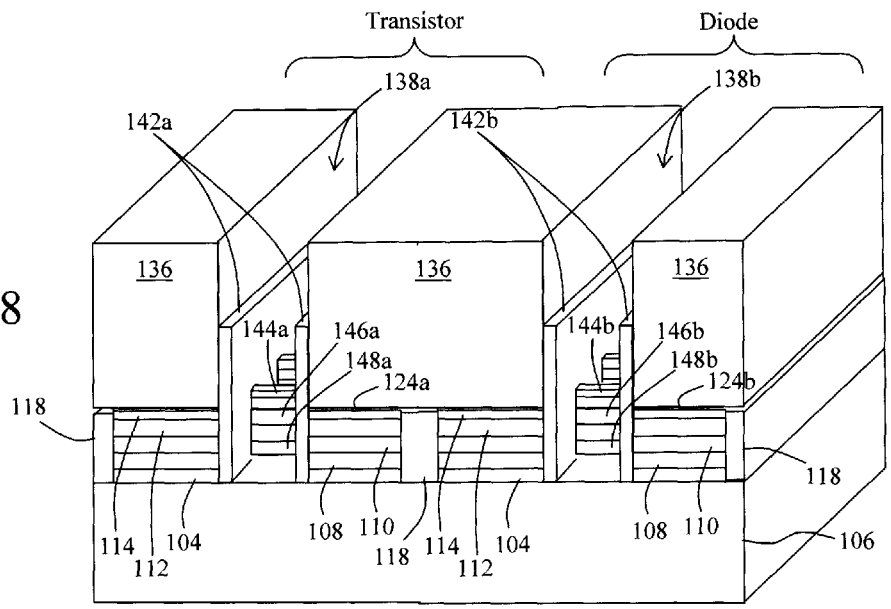
FIG. 8 is a cross-sectional diagram illustrating spacers having been formed in trenches over the nanomesh FET transistor and the nanomesh FET-diode stacks according to an embodiment of the present invention.

FIG. 8 is a cross-sectional diagram illustrating spacers 142a/142b having been formed in trenches 138a/138b over the nanomesh FET transistor and the nanomesh FET-diode stacks, respectively. This step is optional. Placing spacers between what will be the source/drain regions of the devices and the gates (that will be formed in trenches 138a/138b, see FIG. 13, described below) will help to minimize parasitic capacitance in the completed device, but is not necessary for preventing gate-to-source/drain shorting during raised source/drain (RSD) epitaxial growth or silicide, i.e., as in typical FET flows. Spacers 142a/142b serve to offset the gate a certain distance from the source/drain regions.

According to an exemplary embodiment, spacers 142a/142b are formed by first depositing a nitride (e.g., SiN) material into trenches 138a/138b. A resist film (not shown) is then deposited on the nitride material, masked and patterned with a location and footprint of the spacers. A nitride-selective RIE is then used to define spacers 142a/142b in the nitride material. A large timed overetch is needed to clear the sidewalls of the nanowire bar stack, such that the spacers are present only along the sidewalls of the trenches and not on the nanowire bar stack. The minimum pulldown of spacers is thus the height of the nanowire bar stack and remaining (oxide portion 122aii/122bii) nanowire hardmasks. The oxide portions 122aii/122bii of the hardmasks are exposed during the long overetch required to remove the nitride material, and will most likely be eroded during this step due to imperfect selectivity of the nitride etch used to remove the nitride material. Ideally, the oxide portions 122aii/122bii of the hardmasks are designed to be just thick enough to be completely eroded during this step.

Figure 9:
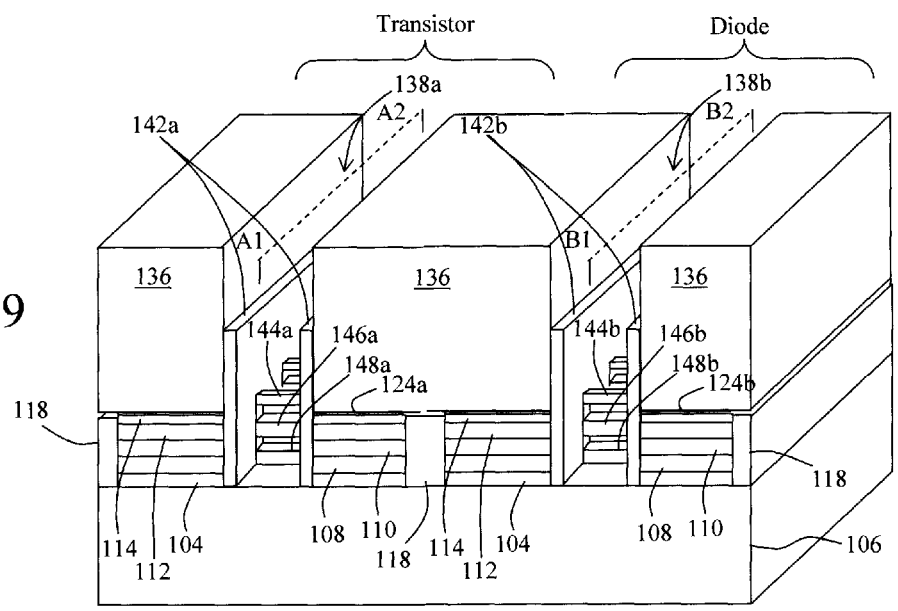
FIG. 9 is a cross-sectional diagram illustrating the sacrificial layers having been removed from between nanowire bars in the nanomesh FET transistor and the nanomesh FET-diode stacks according to an embodiment of the present invention.

FIG. 9 is a cross-sectional diagram illustrating the sacrificial layers having been removed from between nanowire bars 144a/144b, 146a/146b and 148a/148b in the nanomesh FET transistor and the nanomesh FET-diode stacks, respectively. The now-released nanowire bars (144a/144b, 146a/146b and 148a/148b) are the nanowire channels of the device. These multiple layers of nanowire channels are also referred to herein as a nanowire "mesh."

The sacrificial layers may be removed from between the nanowire bars as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching.

According to an exemplary embodiment, the nanowire channels in the nanomesh FET-diode are doped differently than the nanowire channels in the nanomesh FET transistor. While the nanowire channels in the diode are doped with the same polarity as the source/drain pads, the nanowire channels in the nanomesh FET transistor may either remain undoped (which is an important advantage of thin channel, fully depleted devices such as nanowire FETs) or may be doped in the opposite polarity of the source/drain region for threshold voltage adjustment purposes. This can be accomplished in a number of different ways. One way is to selectively remove the doped sacrificial layers from the channel region of the nanomesh FET transistor (leaving the doped sacrificial layers present in the channel region of the nanomesh FET-diode), then performing a solid source diffusion anneal, such as a rapid thermal anneal (RTA), spike anneal and/or laser anneal process, to diffuse and activate the dopants from the sacrificial layers (present (i) in the source and drain regions of the nanomesh FET transistor and (ii) in the source, drain and channel regions of the nanomesh FET-diode) throughout the source/drain regions of the nanomesh FET transistor device layers and throughout the source/drain and channel regions of the nanomesh FET-diode, respectively. Temperatures for this anneal may range from about 1,000° C. to about 1,100° C., and the anneal may vary in duration from a few milliseconds (ms), for example five ms, to a few seconds, for example, five seconds. Following this anneal, the above-described process can be repeated to remove the sacrificial layers remaining in the nanomesh FET-diode device stack.

Figure 10A:
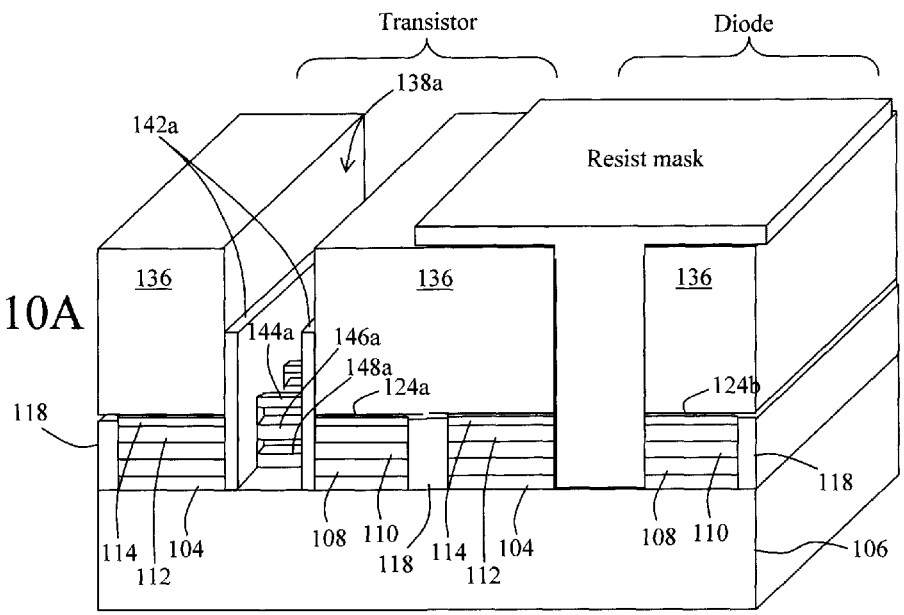
FIG. 10A is a cross-sectional diagram illustrating one exemplary embodiment for achieving selective doping of the nanomesh FET-diode stacks according to an embodiment of the present invention.

In order to achieve selective removal of the sacrificial layers first from the nanomesh FET transistor stack, a resist mask can be formed (using standard lithography patterning techniques) covering the nanomesh FET-diode. This exemplary configuration is shown in FIG. 10A. Once the resist mask is formed over the nanomesh FET-diode stack, the sacrificial layers in the nanomesh FET transistor stack can be removed, as prescribed above, the mask can be removed, the diffusion anneal can be performed, and then the sacrificial layers can be removed from the nanomesh FET-diode stack.

Figure 10B:
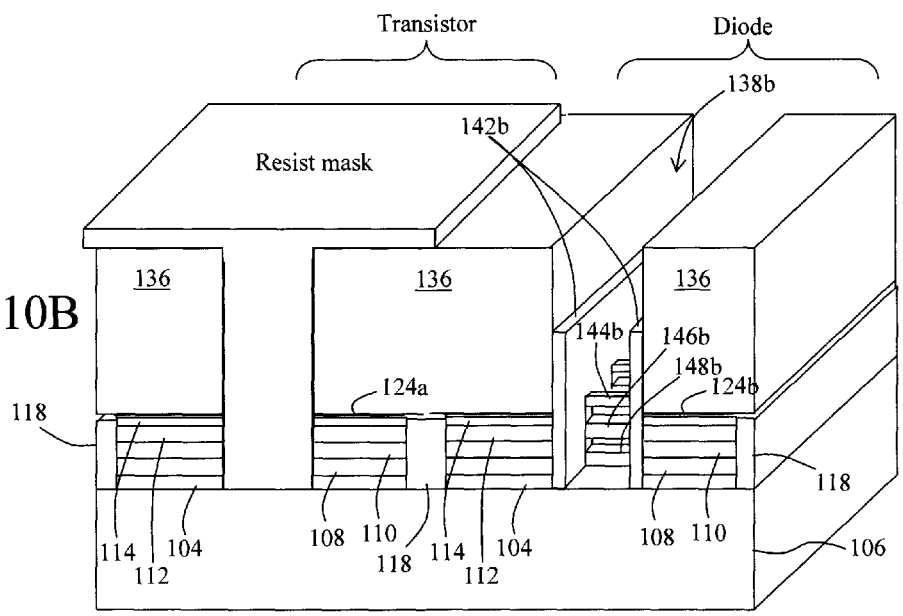
FIG. 10B is a cross-sectional diagram illustrating another exemplary embodiment for achieving selective doping of the nanomesh FET-diode stacks according to an embodiment of the present invention.

Alternatively, the sacrificial layers can be removed from both device stacks (as shown in FIG. 9) and the diffusion anneal can be performed as described above. Following the diffusion anneal, a resist mask can be formed (using standard lithography patterning techniques) covering/masking the nanomesh FET transistor stack as shown in FIG. 10B and selective doping can be performed into the nanomesh FET-diode device stack. Suitable dopants/dopant concentrations were provided above. Following this doping step, the resist mask can be removed.

Next, a gate dielectric is deposited around the nanowires in the channel regions of the nanomesh FET transistor and the nanomesh FET-diode devices. In order to better illustrate this step of the process, reference is now made to cross-sectional cuts along line A1-A2 through the channel region of the nanomesh FET transistor (see FIG. 11A) and along line B1-B2 through the channel region of the nanomesh FET-diode (see FIG. 11B). The orientation of these cuts through the respective devices is shown in FIG. 9.

Figure 11A:
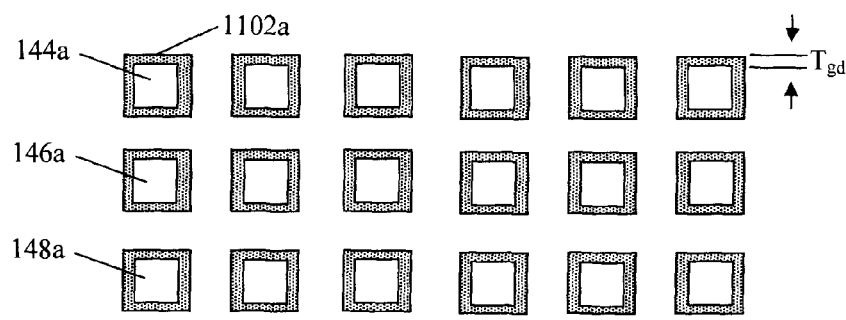
FIG. 11A is a cross-sectional diagram illustrating a gate dielectric having been deposited around the nanowire bars in the channel region of the nanomesh FET transistor according to an embodiment of the present invention.
Figure 11B:
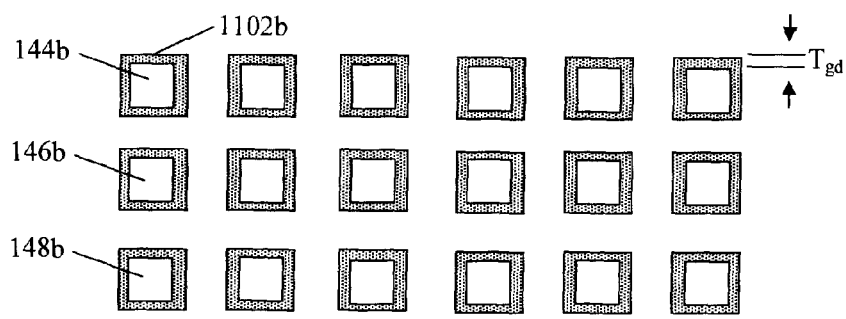
FIG. 11B is a cross-sectional diagram illustrating a gate dielectric having been deposited around the nanowire bars in the channel region of the nanomesh FET-diode according to an embodiment of the present invention.

Specifically, as shown in FIG. 11A a gate dielectric 1102a is deposited around the nanowire bars 144a, 146a and 148a in the channel region of the nanomesh FET transistor. As shown in FIG. 11B a gate dielectric 1102b is deposited around the nanowire bars 144b, 146b and 148b in the channel region of the nanomesh FET-diode. According to an exemplary embodiment, the gate dielectrics 1102a and 1102b are formed from the same material (e.g., a high-k material, such as hafnium oxide or hafnium silicon-oxynitride) that is deposited using a conformal deposition process such as atomic layer deposition (ALD) or chemical vapor deposition (CVD) on the transistor and diode devices concurrently. By way of example only, the gate dielectrics 1102a and 1102b are each deposited (on the respective devices) to a thickness $t_{gd}$ of from about 1 nm to about 5 nm. Ultimately, the goal will be to have the gate dielectric present only in the nanomesh FET transistor separating the nanowire channels from the gate. The gate dielectric will be selectively removed from the nanomesh FET-diode.

Figure 12:
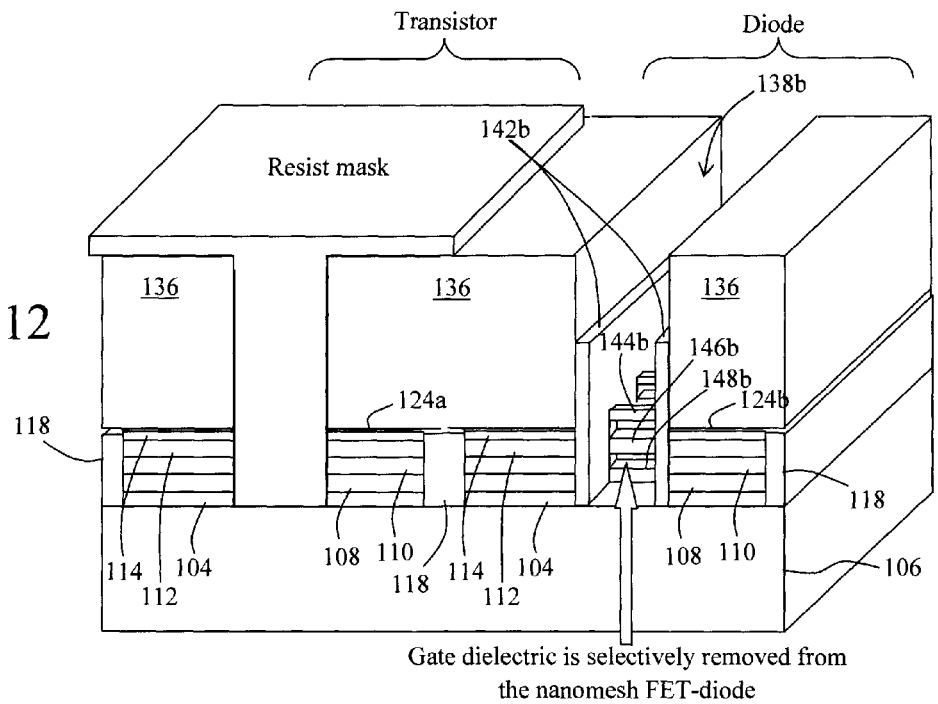
FIG. 12 is a cross-sectional diagram illustrating a resist mask having been formed over the nanomesh FET transistor to protect the gate dielectric in the nanomesh FET transistor such that the gate dielectric can remain in the nanomesh FET transistor according to an embodiment of the present invention.

Namely, switching back now to a cross-sectional view of the wafer, as shown in FIG. 12 standard lithography techniques are used to pattern a resist mask over the nanomesh FET transistor (i.e., thereby protecting the gate dielectric in the nanomesh FET transistor, such that the gate dielectric can remain in the nanomesh FET transistor). The resist mask allows the gate dielectric to be (selectively) removed from only the nanomesh FET-diode device. The gate dielectric is then removed from the nanomesh FET-diode using a wet etching process—this is feasible if done after the gate dielectric deposition, but prior to any subsequent anneal. The resist mask can then be removed.

Figure 13:
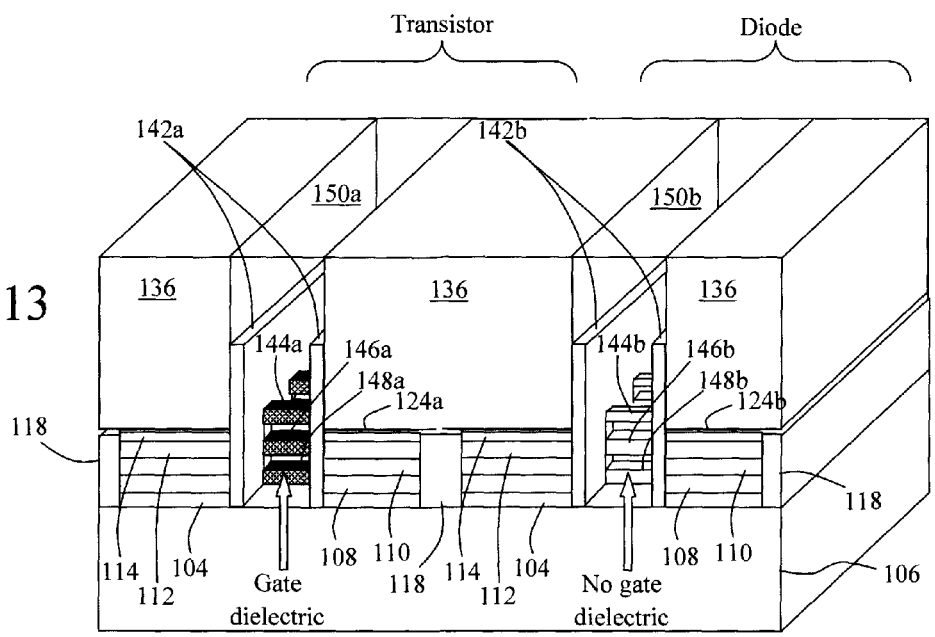
FIG. 13 is a cross-sectional diagram illustrating replacement gates having been formed in the trenches surrounding the nanowire channels in the nanomesh FET transistor and the nanomesh FET-diode devices by filling the trenches with a gate material according to an embodiment of the present invention.

Next, as shown in FIG. 13, a cross-sectional diagram, replacement gates 150*a*/150*b* are formed in trenches 138*a*/138*b* surrounding the nanowire channels in the nanomesh FET transistor and the nanomesh FET-diode devices, respectively, by filling the trenches 138*a*/138*b* with a gate material. Gates 150*a*/150*b* formed in this manner will be common to each of the device layers (i.e., a single gate for multiple device layers).

Once the gate material is filled into trenches, CMP is used to planarize the gates 150*a*/150*b* with filler layer 136 acting as an etch stop. An overpolish may be used to planarize filler layer 136 and the gate material down to the spacers 142*a*/142*b* for a more vertical gate profile. Suitable gate materials include, but are not limited to, one or more of polysilicon, a deposited metal(s) and a hybrid stack of multiple materials such as metal polysilicon. In one exemplary embodiment, the gates formed are metal gates including one or more deposited metals.

As shown in FIG. 13, the gates surround a portion of each of the nanowire channels. This is referred to herein as a gate-all-around or GAA configuration.

Each of the nanomesh FET transistor and FET-diode devices formed according to the above-described process has a plurality of device layers oriented vertically in a stack. Each device layer includes a source region, a drain region and a plurality of nanowires, i.e., a nanowire mesh, connecting the source and drain regions.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An electronic device, comprising:
   an alternating series of device layers and sacrificial layers in a stack on a semiconductor-on-insulator (SOI) wafer having a SOI layer over a buried oxide (BOX), wherein each of the device layers in at least one first portion and in at least one second portion of the stack has a source region, a drain region and nanowire channels connecting the source region and the drain region;
   a conformal gate dielectric layer surrounding the nanowire channels in the at least one first portion of the stack which serve as a channel region of a nanomesh field-effect transistor (FET) transistor;
   a first gate on the conformal gate dielectric layer surrounding the nanowire channels in the at least one first portion of the stack which serve as the channel region of the nanomesh FET transistor in a gate all around configuration; and
   a second gate surrounding the nanowire channels in the at least one second portion of the stack which serve as a channel region of a nanomesh FET-diode in another gate all around configuration,
   wherein the conformal gate dielectric is present only in the nanomesh FET transistor such that: i) the conformal gate dielectric separates the first gate from the nanowire channels in the at least one first portion of the stack which serve as the channel region of the nanomesh FET transistor, and ii) the second gate surrounds and is in direct contact with a portion of each of the nanowire channels in the at least one second portion of the stack which serve as the channel region of the nanomesh FET-diode.

2. The device of claim 1, further comprising:
   at least one shallow trench isolation region isolating the at least one first portion of the stack from the at least one second portion of the stack.

3. The device of claim 1, wherein the source region and the drain region in each of the device layers in the at least one first portion of the stack is doped.

4. The device of claim 1, wherein the nanowire channels in each of the device layers in the at least one first portion of the stack is undoped.

5. The device of claim 1, wherein the source region, the drain region and the nanowire channels in each of the device layers in the at least one second portion of the stack is doped.

6. The device of claim 1, wherein the conformal gate dielectric layer comprises a high-k material.

7. The device of claim 6, wherein the conformal gate dielectric layer comprises hafnium oxide or hafnium silicon-oxynitride.

8. The device of claim 6, wherein the conformal gate dielectric layer comprises hafnium silicon-oxynitride.

* * * * *